(12) United States Patent
Chang

(10) Patent No.: US 7,351,936 B1
(45) Date of Patent: Apr. 1, 2008

(54) METHOD AND APPARATUS FOR PREVENTING BAKING CHAMBER EXHAUST LINE CLOG

(75) Inventor: Chia-Tung Chang, Hsien (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 11/625,599

(22) Filed: Jan. 22, 2007

(51) Int. Cl.
*F27D 11/00* (2006.01)
*C23C 16/00* (2006.01)

(52) U.S. Cl. ............... 219/400; 219/405; 219/390; 219/411; 392/416; 392/418; 118/724; 118/725; 118/728; 118/730

(58) Field of Classification Search .......... 219/400, 219/405, 390, 411; 392/416, 418; 118/724–5, 118/728–30
See application file for complete search history.

(56) References Cited

U.S. PATENT DOCUMENTS

| | | | | |
|---|---|---|---|---|
| 4,940,213 A | * | 7/1990 | Ohmine et al. | 266/152 |
| 5,322,567 A | * | 6/1994 | Deaton et al. | 118/715 |
| 6,830,618 B2 | * | 12/2004 | Hara et al. | 117/200 |

* cited by examiner

*Primary Examiner*—Shawntina Fuqua
(74) *Attorney, Agent, or Firm*—Haynes Boone, LLP

(57) ABSTRACT

A method and apparatus involve providing a supply of nitrogen gas, heating the supply of nitrogen gas to a temperature, and ejecting the heated nitrogen gas through the exhaust line of the baking chamber on a periodic basis. The temperature is between a temperature of the hot plate and a temperature that is less than a glass transition temperature of a film being treated.

22 Claims, 4 Drawing Sheets

METHOD AND APPARATUS FOR PREVENTING BAKING CHAMBER EXHAUST LINE CLOG

BACKGROUND

This invention relates generally to semiconductor device manufacturing and more specifically to a method of preventing clogs in an exhaust line of a baking chamber for use in semiconductor manufacture.

In semiconductor manufacture, photolithography is a process that produces circuit patterns on a surface of a wafer using light-sensitive photoresist material and controlled exposure to light. Applying and developing the photoresist material involves several heating steps that are performed within an enclosed chamber of a wafer track system. The wafer is heated on a hot plate and air flows through the chamber to ensure film uniformity and to exhaust out the evaporated solvent coming from the photoresist.

A problem with heating the wafer within the enclosed chamber is that a temperature difference between the hot plate and the chamber cover causes condensation of the evaporated solvent and thus, produces small powdery particles that attach to and clog up the exhaust line of the chamber cover. Maintaining and cleaning the exhaust line is time-consuming which results in a long down time of the chamber. What is needed is a simple and cost-effective method for preventing clogs in the exhaust line to reduce the down time of the chamber and to secure a contamination-free environment for the chamber.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
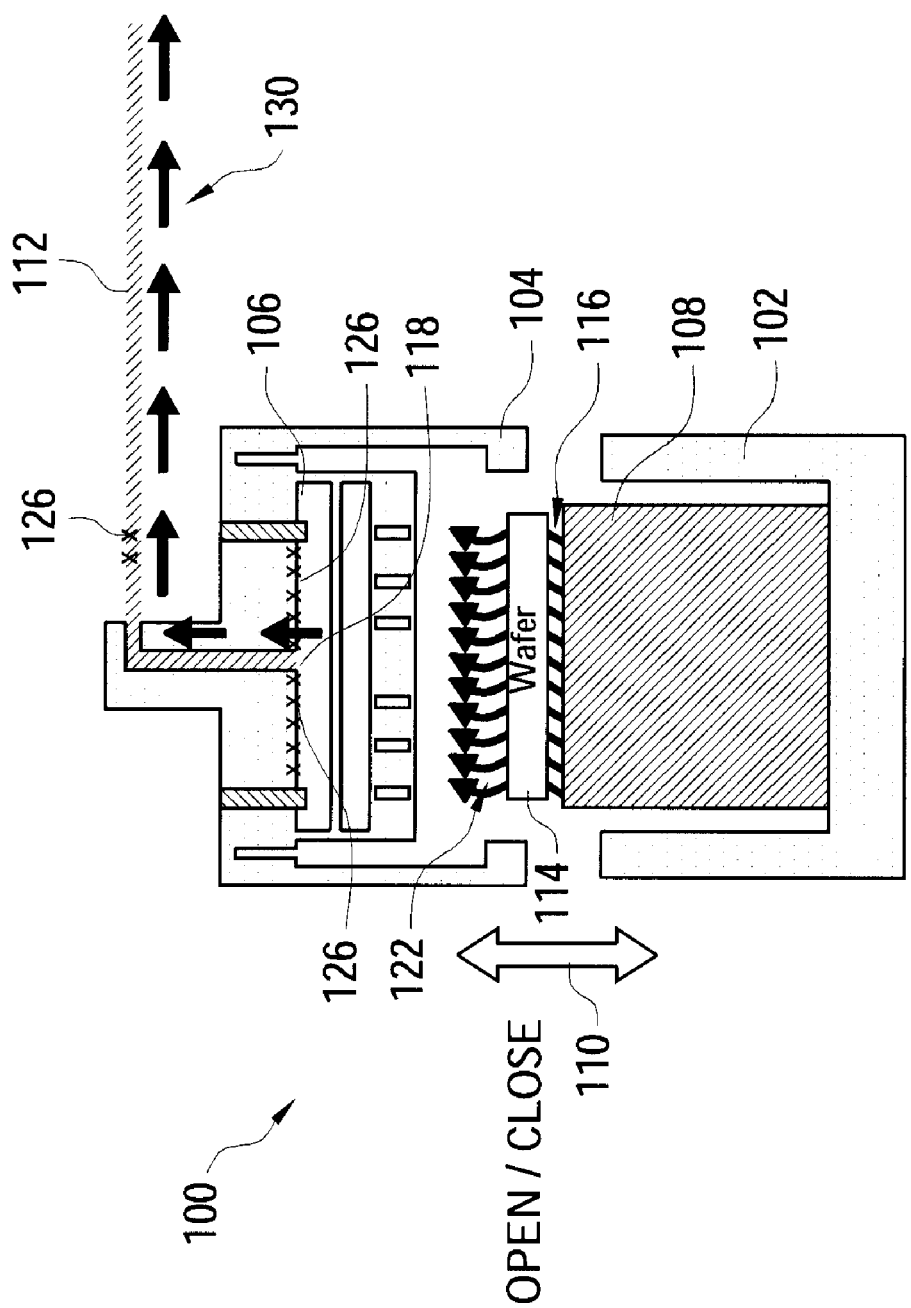
FIG. 1 is a simplified sectional view of a baking chamber for use in semiconductor manufacture.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, a baking chamber 100 for use in semiconductor manufacture is shown. The baking chamber 100 comprises a lower portion 102, an upper portion 104, a chamber cover 106, and a hot plate 108. The upper portion 104 may be vertically movable in a direction 110 to open and close the baking chamber 100. The upper portion 104, which is integral with chamber cover 106, includes an exhaust line 112 for exhausting an atmosphere inside the chamber 100 during operation. The bottom portion 102 houses or supports the hot plate 108 for heat treating a wafer 114 during several processing steps of semiconductor manufacture. For the sake of example, the wafer 114 may undergo a pre-bake (also called soft bake) after a photoresist material or bottom antireflective coating (BARC) film has been applied to the wafer surface. The pre-bake is performed to evaporate most of the solvent in the photoresist and/or BARC film.

Alternatively, the wafer 114 may undergo other heat treatments such as a post exposure bake (PEB), a post developer bake (PDB), a top antireflective coating (TARC) treatment, a immersion top coating (ITC) or SOAK treatment, an HMDS adhesion priming treatment, or any other treatments known in the art.

In operation, the upper portion 104 is moved vertically 110 down towards the lower portion 102 until the baking chamber 100 is enclosed. Continuing with the example, the wafer 108 includes a photoresist film or a BARC film that has been applied to the surface of the wafer 114 by a method such as spin-coating. The wafer 114 may be placed on a plurality of protrusions on the surface of the hot plate 108 and held in place by a vacuum (not shown). The hot plate 108 may be heated to a target temperature which is dependent on the type of film material being heat treated. For the sake of example, the target temperature of the hot plate 108 for photoresist material is between about 90 to 130 degree C. and for BARC film is between about 205 to 215 degree C. The heat 120 generated by the hot plate 108 is conducted through contact with the backside of the wafer 114 and to the photoresist or BARC film on the surface of the wafer. As stated above, the soft bake evaporates the solvent of the photoresist or BARC film. As the photoresist or BARC film reaches its glass transition temperature (Tg), the solvent molecules become more mobile and diffuse upwards accumulating at the film surface. As the temperature of the film continues to rise, the solvent molecules start to evaporate 122 and move towards an entrance 118 of the exhaust line 112 located in the chamber cover 106.

Alternatively, the target temperature of the hot plate 108 for the post exposure bake (PEB) is between about 90 to 115 degree C., the post developer bake (PDB) is between about 90 to 115 degree C., the top antireflective coating (TARC) treatment is between about 90 to 115 degree C., the immersion top coating (ITC) or SOAK treatment is between about 90 to 115 degree C., and the HMDS adhesion priming treatment is between about 100 to 120 degree C.

The chamber cover 106 comprises the exhaust line 112 to exhaust out an atmosphere inside the baking chamber 100 (as shown by the arrows 130). The exhaust line 112 allows the evaporated solvent 122 to be exhausted out of the chamber 100 and secures a contamination-free environment for the chamber. Additionally, the exhaust line 112 may allow air to flow evenly throughout the chamber 100 which provides for a uniform film topography on the wafer 114 surface. However, the chamber cover 106 and exhaust line 112 may have a temperature that is less than the hot plate 108 temperature. Due to this temperature difference, the evaporated solvent 122 may condense into powdery particles 126 that attach to the chamber cover 106 and the exhaust line 112. Over time, these contamination particles 126 may cause defects in future wafer processing steps resulting in lower yields. Furthermore, the particles 126 may clog up the exhaust line 112 such that the chamber 100 is no longer operable. Maintaining and cleaning the chamber cover 106 and exhaust line 112 is time-consuming and results in long down time of the baking chamber 100.

Figure 2:
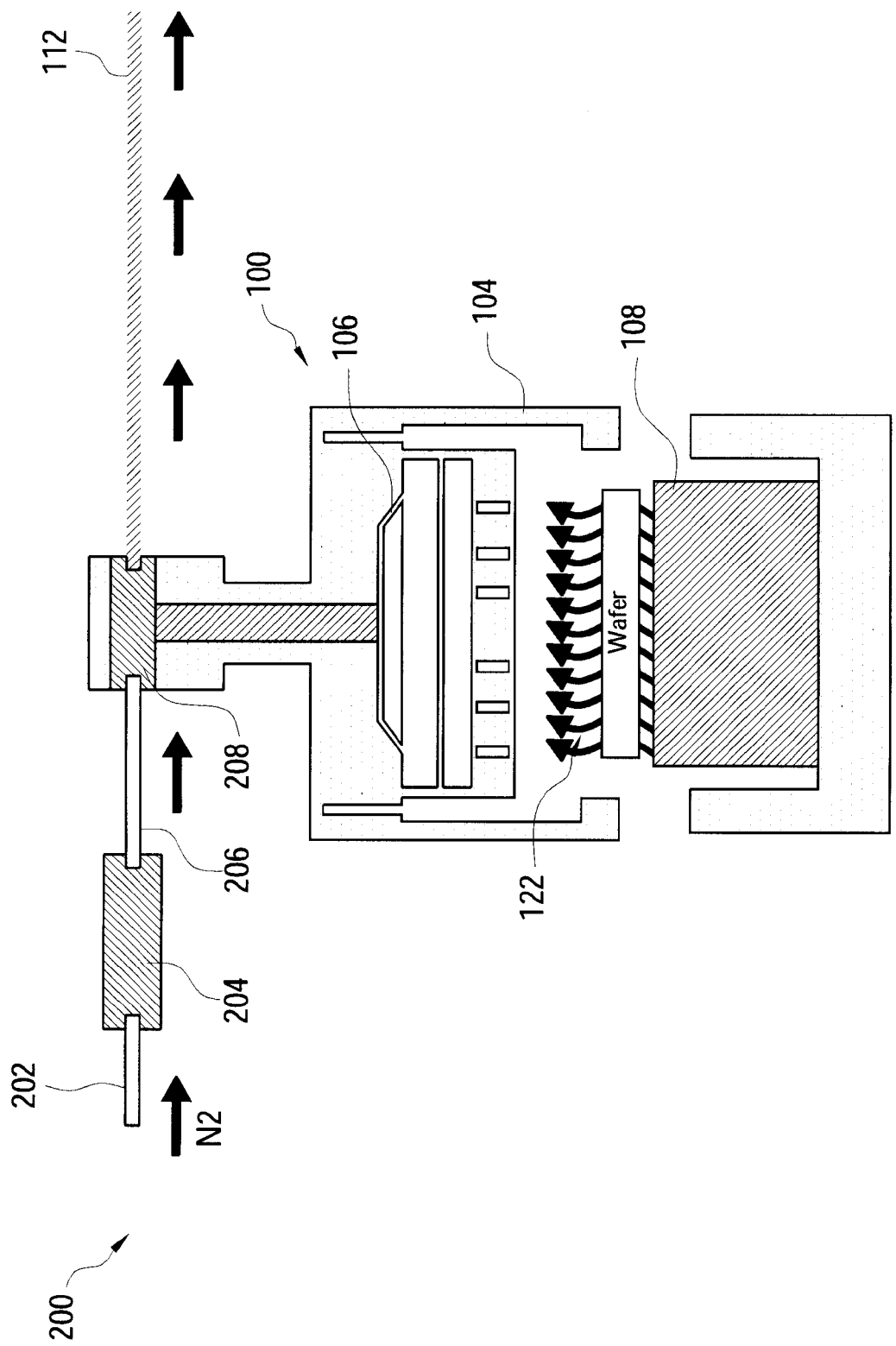
FIG. 2 is a simplified sectional view of a baking chamber with an improved exhaust system according to one or more embodiments of the present disclosure.

Referring now to FIG. 2, a baking chamber and exhaust system 200 prevents clogs in an exhaust line of the baking chamber 100. The baking chamber and exhaust system 200 includes a supply of nitrogen gas that is coupled to an in-port 202 of a heating device 204. The heating device 204 may be located outside of the baking chamber 100. The system 200 may also comprise an ejector 208 that may be coupled to an out-port 206 of the heating device 204. The ejector 208 may be integral with the upper portion 104 of the chamber 100. Alternatively, the ejector may be located outside the baking chamber 100. The ejector 208 may be coupled to the exhaust line 112 of the baking chamber 100.

In operation, the supply of nitrogen gas is heated by the heating device 204 to a temperature that is between the hot plate 108 temperature and a temperature that is less than the glass transition temperature of the film being treated. As discussed above, the temperature of the hot plate 108 is dependent on the type of film material. For the sake of example, the target temperature of the hot plate 108 for the photoresist is between 90 to 130 degree C. and for the BARC film is between 205 to 215 degree C. Alternatively, the target temperature of the hot plate 108 for the TARC film is between 90 to 115 degree C., the ITC or SOAK film is between 90 to 115 degree C., and the HMDS adhesion promoter is between 100 to 120 degree C. Furthermore, the target temperature of the hot plate 108 for the post-exposure bake (PEB) or post developer bake (PDB) is between 90 to 115 degree C. The temperature of the heated nitrogen gas is kept less than the glass transition temperature (Tg) of the film being treated to prevent any chemical reactions with the film and to ensure stability of the film properties. Therefore, the heating device 204 may have an adjustable temperature controller. The ejector 208 may eject the heated nitrogen gas through the exhaust line 112 of the baking chamber 100 to prevent the evaporated solvent 122 from condensing in the exhaust line. Additionally, the heated nitrogen gas does not react with the photoresist or the BARC film. The heated nitrogen gas may be ejected on a periodic basis and the period may be customized to suit a particular semiconductor manufacturer. The ejector 208 may eject the heated nitrogen gas through the exhaust line 112 after the baking process. Alternatively, the ejector 208 may eject the heated nitrogen gas through the exhaust line 112 during the baking process.

Figure 3:
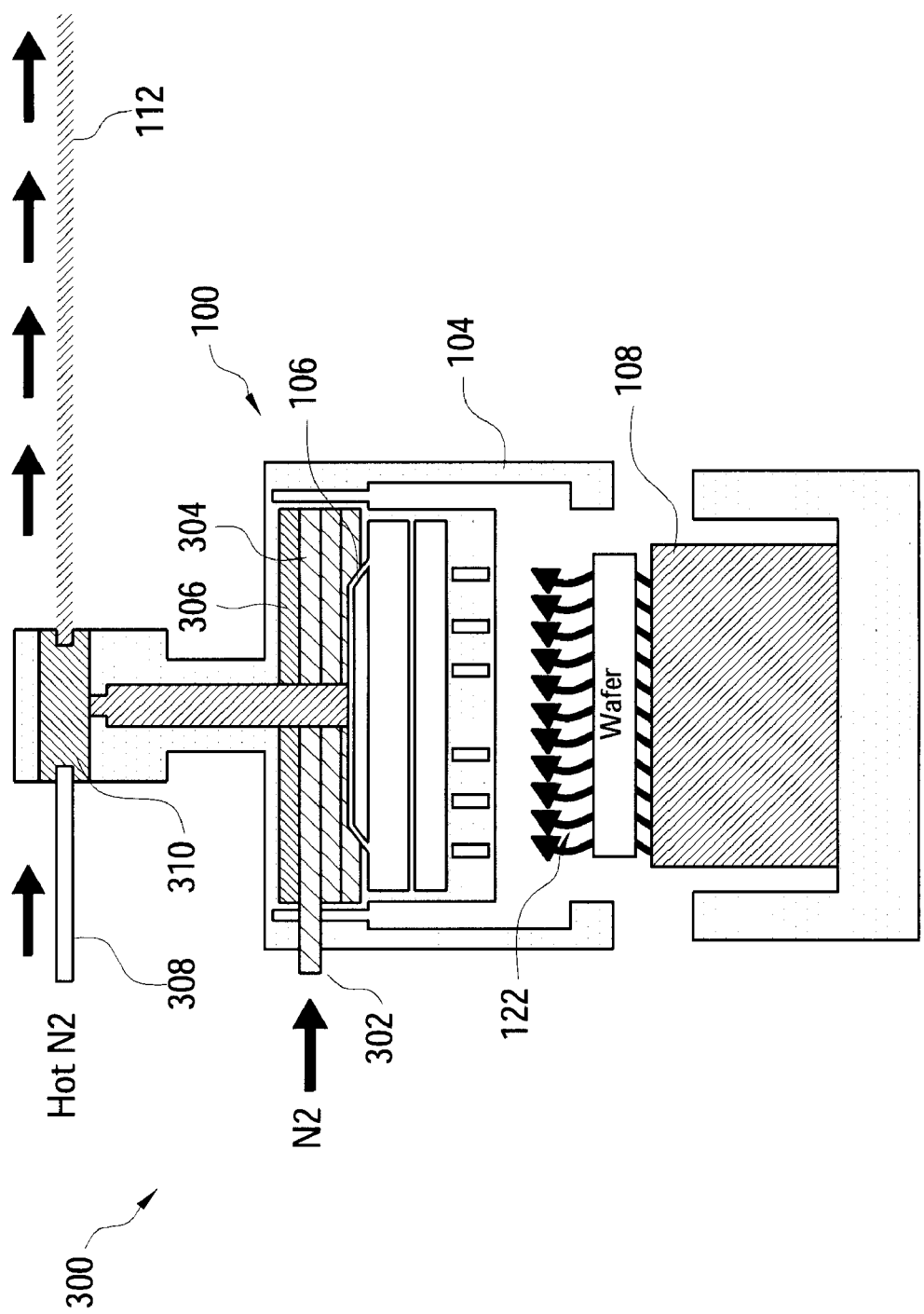
FIG. 3 is a simplified sectional view of a baking chamber with an improved exhaust system according to another embodiment of the present disclosure.

Referring now to FIG. 3, a baking chamber and exhaust system 300 prevents clogs in an exhaust line of the baking chamber 100. The baking chamber 100 of FIG. 3 is similar to that of FIGS. 1 and 2, with changes and additions disclosed in the figures and/or discussed below. The baking chamber and exhaust system 300 includes a supply of nitrogen gas that is coupled to an in-port 302 of a buffer layer 304. The buffer layer 304 may be integral with the upper portion 104 of the baking chamber 100. The system 300 also may comprise an in-situ heater 306 that is located within the upper portion 104 of the baking chamber 100. The buffer layer 304 may be located between the chamber cover 106 and the in-situ heater 306. The buffer layer 304 may comprise an out-port (not shown) that may be coupled to an in-port 308 of an ejector 310. The ejector 310 may be integral with the upper portion 104 of the baking chamber 100. Alternatively, the ejector 310 may be outside the baking chamber 100. The ejector 310 may be coupled to the exhaust line 112 of the baking chamber 100.

In operation, the supply of nitrogen gas is heated to the same temperature as discussed in FIG. 2. However, the supply of nitrogen gas is heated inside the baking chamber 100 instead of outside. The supply of nitrogen gas enters through the in-port 302 of the buffer layer 304. As the nitrogen gas passes along inside the buffer layer 304, the heater 306 located on top of the buffer layer heats the nitrogen gas. Additionally, the chamber cover 106 may be heated by the heated nitrogen gas passing along inside the buffer layer 304 since the cover lies directly beneath the buffer layer. The temperature of the chamber cover 106 may be substantially equal to the temperature of the heated nitrogen gas. This will prevent the evaporated solvent 122 from condensing on the chamber cover 106. The heated nitrogen gas then enters into the ejector 310 and may be ejected through the exhaust line 112 of the baking chamber to prevent the evaporated solvent 122 from condensing in the exhaust line. The heated nitrogen gas may be ejected on a periodic basis and the period may be customized to suit a particular semiconductor manufacturer. The ejector 310 may eject the heated nitrogen gas through the exhaust line 112 after the baking process. Alternatively, the ejector 310 may eject the heated nitrogen gas through the exhaust line 112 during the baking process.

Figure 4:
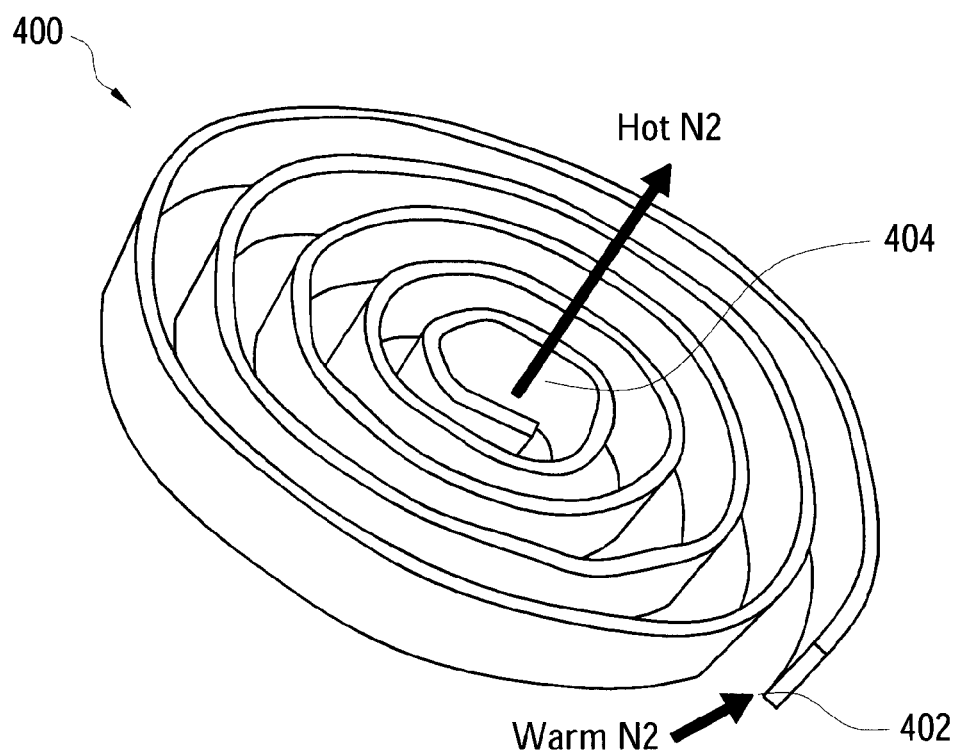
FIGS. 4 & 5 are simplified plane views of a buffer layer for use in the baking chamber of FIG. 3.

Referring now to FIG. 4, the buffer layer 304 of the baking chamber and exhaust system 300 includes, in a first embodiment, a buffer layer design 400. The buffer layer design 400 includes a circular pattern. The supply of nitrogen gas enters the buffer layer 304 (with the design 400) at an outer most radius 402 and continues in the circular pattern until the nitrogen gas reaches a center 404 of the buffer layer. As the nitrogen gas travels along the circular pattern, the heater 306 (FIG. 3) heats the nitrogen gas. The heated nitrogen gas exits the center 404 of the buffer layer design 400 and is ready for the ejector 310 (FIG. 3).

Figure 5:
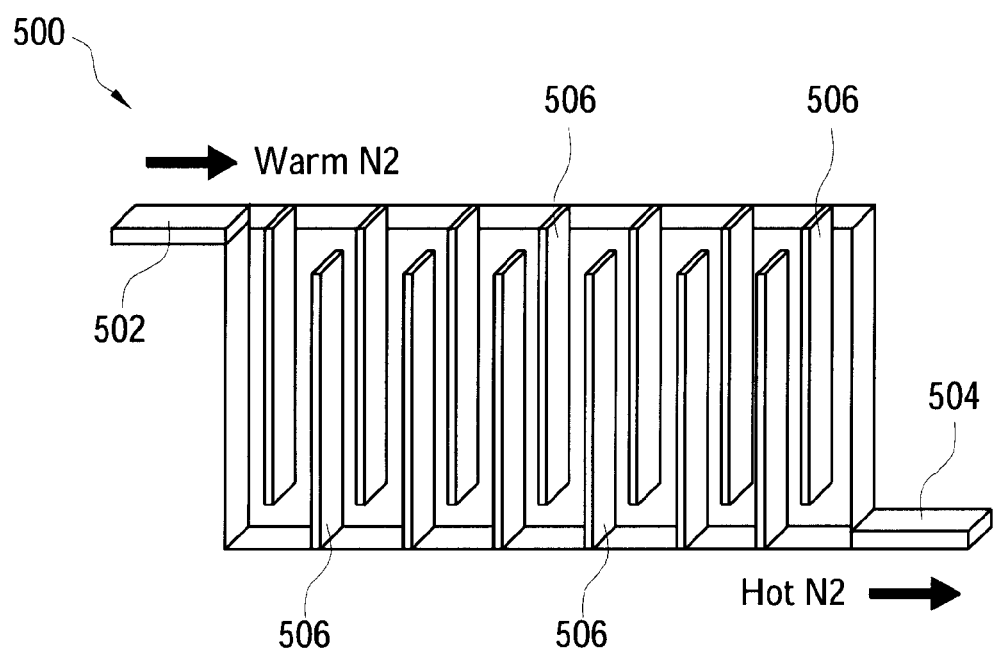

Referring now to FIG. 5, the buffer layer 304 of the baking chamber and exhaust system 300 includes, in a second embodiment, a buffer layer design 500. The buffer layer design 500 includes a rectangular pattern having a plurality of projections 506 on either side of the rectangle. The plurality of projections 506 form an up-down path for the nitrogen gas. The supply of nitrogen gas enters the buffer layer (with the design 500) at one side 502 of the rectangular pattern and continues in the up-down path until the nitrogen gas reaches an opposite side 504 of the rectangular pattern. As the nitrogen gas travels along the up-down path within the rectangular pattern, the heater 306 (FIG. 3) heats the nitrogen gas. The nitrogen gas exits the opposite side 504 of the buffer layer design 500 and is ready for the ejector 310 (FIG. 3).

In additional embodiments, the buffer layer 304 may be configured to have a different shape other than a circle or rectangle and may vary in the number of concentric circles and/or projections.

Thus, provided is a method for preventing clogs in an exhaust line of a baking chamber having a hot plate. In one embodiment, the method comprises providing a supply of nitrogen gas, heating the supply of nitrogen gas to a temperature, and ejecting the heated nitrogen gas through the exhaust line of the baking chamber on a periodic basis. The temperature is between a hot plate temperature and a temperature that is less than a glass transition temperature of a film being treated. In other embodiments, heating the supply of nitrogen gas is performed by a heater outside the baking chamber.

In other embodiments, heating the supply of nitrogen gas is performed by a heater inside the baking chamber. The heater is located within a chamber cover and also heats up the chamber cover to a temperature that is substantially equal to the temperature of the heated nitrogen gas. In still other embodiments, the film includes a material selected from a group consisting of a photoresist, a top antireflective coating (TARC), an immersion top coating (ITC), and a HMDS adhesion promoter and the hot plate temperature is between 90 and 130 degree C. In other embodiments, the film includes a bottom antireflective coating material and the hot plate temperature is between 205 and 215 degree C.

In another embodiment, a system for preventing clogs in an exhaust line of a baking chamber having a hot plate is provided. The system comprises a supply of nitrogen gas, a heater for heating the supply of nitrogen gas to a temperature, and an ejector coupled to the exhaust line of the baking chamber for ejecting the heated supply of nitrogen gas through the exhaust line on a periodic basis. The temperature is between a hot plate temperature and a temperature that is less than a glass transition temperature of a film being treated. In other embodiments, the heater is located inside the baking chamber. The system further comprises a buffer layer located between the heater and a chamber cover, wherein the supply of nitrogen gas is heated by the heater as the nitrogen gas passes through the buffer layer. The supply of nitrogen gas is heated by the heater as the nitrogen gas passes along inside the buffer layer. The chamber cover is heated to a temperature that is substantially equal to the temperature of the heated supply of nitrogen gas.

In other embodiments, the heater includes a design by which the supply of nitrogen gas can travel to heat the cover and then exit through the exhaust line. In still other embodiments, the hot plate is positioned at a first portion of the baking chamber and the heater is performed at an opposite portion of the baking chamber. The heater is positioned proximate the exhaust line.

In another embodiment, an apparatus for preventing clogs in an exhaust line of a baking chamber having a hot plate is provided. The apparatus comprises a heater having an in-port and an out-port and a supply of fluid coupled to the in-port of the heater, wherein the heater heats the supply of fluid to a temperature. The apparatus also includes an ejector coupled to the out-port of the heater for ejecting the heated supply of fluid through the exhaust line. The temperature is between a temperature of the hot plate and a temperature that is less than a glass transition temperature (Tg) of a film being treated. In some embodiments, the heater is inside the baking chamber. In other embodiments, the heater heats a chamber cover to a temperature that is substantially equal to the temperature of the heated fluid. In other embodiments, the heater is outside the baking chamber. In still other embodiments, the heater is shaped with the in-port on an exterior portion of the heater and the out-port on an interior portion of the heater, and the exhaust line is positioned near the out-port.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method for preventing clogs in an exhaust line of a baking chamber having a hot plate, the method comprising:
   providing a supply of inert gas;
   heating the supply of inert gas to an elevated temperature; and
   ejecting the heated inert gas through the exhaust line of the baking chamber on a periodic basis;
   wherein the elevated temperature is between a hot plate temperature and a temperature that is less than a glass transition temperature (Tg) of a film being treated.

2. The method of claim 1, wherein the providing includes configuring the inert gas to include nitrogen and the heating of the supply of nitrogen gas is performed by a heater outside the baking chamber.

3. The method of claim 1, wherein the inert gas includes nitrogen and the heating of the supply of nitrogen gas is performed by a heater inside the baking chamber.

4. The method of claim 3, wherein the heater is located within a chamber cover.

5. The method of claim 4, further comprises heating the chamber cover to a temperature that is substantially equal to the temperature of the heated supply of nitrogen gas.

6. The method of claim 1, wherein the film includes a material selected from a group consisting of a photoresist, a top antireflective coating (TARC), an immersion top coating (ITC), and a HMDS adhesion promoter.

7. The method of claim 6, wherein the hot plate temperature is between 90 to 130 degree C.

8. The method of claim 1, wherein the film includes a bottom antireflective coating (BARC) material.

9. The method of claim 8, wherein the hot plate temperature is between 205 and 215 degree C.

10. A system for preventing clogs in an exhaust line of a baking chamber having a hot plate, the system comprising:
    a supply of nitrogen gas;
    a heater for heating the supply of nitrogen gas to a temperature; and
    an ejector coupled to the exhaust line of the baking chamber for ejecting the heated supply of nitrogen gas through the exhaust line on a periodic basis;
    wherein the temperature is between a hot plate temperature and a temperature that is less than a glass transition temperature (Tg) of a material being treated.

11. The system of claim 10, wherein the heater is located inside the baking chamber.

12. The system of claim 11, further comprising a buffer layer located between the heater and a chamber cover, wherein the supply of nitrogen gas is heated by the heater as the nitrogen gas passes through the buffer layer.

13. The system of claim 12, wherein the chamber cover is heated as the heated nitrogen gas passes through the buffer layer.

14. The system of claim 13, wherein the chamber cover is heated to a temperature that is substantially equal to the temperature of the heated supply of nitrogen gas.

15. The system of claim 13, wherein the heater includes a design by which the supply of nitrogen gas can travel to heat the cover and then exit through the exhaust line.

16. The system of claim 10, wherein the hot plate is positioned at a first portion of the baking chamber and the heater is performed at an opposite portion of the baking chamber.

17. The system of claim 16, wherein the heater is positioned proximate to the exhaust line.

18. An apparatus for preventing clogs in an exhaust line of a baking chamber having a hot plate, the apparatus comprising:
    a heater having an in-port and an out-port;
    a supply of fluid coupled to the in-port of the heater, wherein the heater heats the supply of fluid to a temperature; and
    an ejector coupled to the out-port of the heater for ejecting the heated supply of fluid through the exhaust line;
    wherein the temperature is between a temperature of the hot plate and a temperature that is less than a glass transition temperature (Tg) of a film being treated.

19. The apparatus of claim 18, wherein the heater is inside the baking chamber.

20. The apparatus of claim 19, wherein the heater also heats a chamber cover to a temperature that is substantially equal to the temperature of the heated fluid.

21. The apparatus of claim 18, wherein the heater is outside the baking chamber.

22. The apparatus of claim 18, wherein the heater is shaped with the in-port on an exterior portion of the heater and the out-port on an interior portion of the heater, and wherein the exhaust line is positioned near the out-port.

* * * * *